(12) United States Patent
Yamada et al.

(10) Patent No.: US 11,881,420 B2
(45) Date of Patent: Jan. 23, 2024

(54) LIGHT-IRRADIATION THERMAL TREATMENT APPARATUS

(71) Applicant: SCREEN Holdings Co., Ltd., Kyoto (JP)

(72) Inventors: Takahiro Yamada, Kyoto (JP); Makoto Abe, Kyoto (JP); Kazuhiko Fuse, Kyoto (JP); Jun Watanabe, Kyoto (JP); Shinji Miyawaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 295 days.

(21) Appl. No.: 17/167,121

(22) Filed: Feb. 4, 2021

(65) Prior Publication Data

US 2021/0159099 A1 May 27, 2021

Related U.S. Application Data

(63) Continuation of application No. 15/649,052, filed on Jul. 13, 2017, now Pat. No. 10,950,472.

(30) Foreign Application Priority Data

Sep. 14, 2016 (JP) .................................. 2016-179382

(51) Int. Cl.
*H01L 21/67* (2006.01)
*H01L 21/265* (2006.01)
(Continued)

(52) U.S. Cl.
CPC ...... *H01L 21/67115* (2013.01); *H01L 21/265* (2013.01); *H01L 21/324* (2013.01);
(Continued)

(58) Field of Classification Search
CPC ............ H05B 3/0047; H01L 21/68757; H01L 21/67248; H01L 21/324; H01L 21/265; H01L 21/67115
(Continued)

(56) References Cited

U.S. PATENT DOCUMENTS 5,156,820 A * 10/1992 Wong .................... C30B 25/105
392/416
5,326,725 A * 7/1994 Sherstinsky .......... C23C 16/042
118/503
(Continued)

FOREIGN PATENT DOCUMENTS

CN 101231941 A 7/2008
CN 103088414 A 5/2013
(Continued)

OTHER PUBLICATIONS

Third Office Action dated Oct. 18, 2021 in corresponding Chinese Patent Application No. 201710649400.9 with Japanese translation and partial English translation based on the Japanese translation. Portions relevant to prior-art based rejections are translated.
(Continued)

*Primary Examiner* — Jimmy Chou
(74) *Attorney, Agent, or Firm* — OSTROLENK FABER LLP

(57) ABSTRACT

A ring support is attached to an inner wall surface of a chamber that houses a semiconductor wafer to support a susceptor. When the semiconductor wafer is placed on the susceptor, an inner space of the chamber is separated into an upper space and a lower space. Particles are likely to accumulate on a lower chamber window as a floor part of the chamber. However, since the upper space and the lower space are separated, the semiconductor wafer can be prevented from being contaminated by the particles flowing into the upper space and adhering to a surface of the
(Continued)

semiconductor wafer even when the particles on the lower chamber window are blown up by irradiation with flash light.

3 Claims, 8 Drawing Sheets

(51) Int. Cl.
 *H01L 21/324* (2006.01)
 *H01L 21/687* (2006.01)
 *H05B 3/00* (2006.01)
(52) U.S. Cl.
 CPC .. *H01L 21/67248* (2013.01); *H01L 21/68757* (2013.01); *H05B 3/0047* (2013.01)
(58) Field of Classification Search
 USPC ............... 219/385, 390, 444.1, 416; 392/416
 See application file for complete search history.

(56) References Cited

U.S. PATENT DOCUMENTS

| | | | | |
|---|---|---|---|---|
| 5,834,737 A * | 11/1998 | Hirose | C03C 17/001 | 219/390 |
| 5,870,526 A * | 2/1999 | Aschner | C23C 16/4401 | 219/390 |
| 5,888,304 A * | 3/1999 | Umotoy | C23C 16/4585 | 118/728 |
| 5,960,555 A * | 10/1999 | Deaton | C23C 16/45521 | 34/58 |
| 6,063,440 A * | 5/2000 | Chen | H01L 21/68 | 438/758 |
| 6,099,648 A * | 8/2000 | Anderson | C23C 16/481 | 118/724 |
| 6,153,260 A * | 11/2000 | Comita | C23C 16/481 | 118/728 |
| 6,156,079 A * | 12/2000 | Ho | H05B 3/0047 | 392/416 |
| 6,179,924 B1 * | 1/2001 | Zhao | C23C 16/52 | 118/728 |
| 6,423,947 B2 * | 7/2002 | Womack | H01L 21/67109 | 118/724 |
| 6,507,006 B1 * | 1/2003 | Hiramatsu | H01L 21/67103 | 219/444.1 |
| 6,562,186 B1 * | 5/2003 | Saito | H01L 21/31116 | 118/712 |
| 6,623,563 B2 * | 9/2003 | Hosokawa | C23C 16/4581 | 219/544 |
| 6,639,189 B2 * | 10/2003 | Ramanan | H01L 21/67109 | 219/390 |
| 6,682,627 B2 * | 1/2004 | Shamouilian | C04B 41/4842 | 118/733 |
| 6,716,287 B1 * | 4/2004 | Santiago | C23C 16/4412 | 438/758 |
| 6,730,175 B2 * | 5/2004 | Yudovsky | C23C 16/4586 | 156/345.52 |
| 6,753,507 B2 * | 6/2004 | Fure | H05B 3/143 | 219/465.1 |
| 6,753,508 B2 * | 6/2004 | Shirakawa | H01L 21/67109 | 219/448.11 |
| 6,756,568 B1 * | 6/2004 | Furukawa | H05B 3/74 | 219/548 |
| 6,803,546 B1 * | 10/2004 | Boas | H01L 21/67109 | 118/724 |
| 6,815,646 B2 * | 11/2004 | Ito | H01L 21/67109 | 219/465.1 |
| 6,838,646 B2 * | 1/2005 | Inazumachi | H01L 21/67109 | 118/724 |
| 6,936,797 B2 * | 8/2005 | Hosokawa | G21K 5/04 | 118/729 |
| 6,960,743 B2 * | 11/2005 | Hiramatsu | H01L 21/68785 | 219/444.1 |
| 7,024,105 B2 * | 4/2006 | Fodor | C23C 16/46 | 219/390 |
| 7,044,399 B2 * | 5/2006 | Goto | C23C 16/4581 | 219/443.1 |
| 7,138,606 B2 * | 11/2006 | Kanno | H01L 21/67109 | 118/724 |
| 7,156,951 B1 * | 1/2007 | Gao | H01L 21/67109 | 118/724 |
| 7,211,153 B2 * | 5/2007 | Kuibira | C04B 35/581 | 501/153 |
| 7,361,865 B2 * | 4/2008 | Maki | H05B 3/143 | 219/544 |
| 7,432,476 B2 * | 10/2008 | Morita | F27B 5/04 | 118/725 |
| 7,467,901 B2 * | 12/2008 | Kamei | H01L 21/68778 | 430/311 |
| 7,674,336 B2 * | 3/2010 | Honma | C30B 31/10 | 118/733 |
| 7,718,925 B2 * | 5/2010 | Goto | H01L 21/67103 | 118/724 |
| 7,803,246 B2 * | 9/2010 | Huang | H01J 37/32091 | 156/345.55 |
| 7,815,740 B2 * | 10/2010 | Oohashi | H01J 37/32724 | 118/724 |
| 7,927,096 B2 * | 4/2011 | Fukumoto | H01L 21/67103 | 432/259 |
| 7,959,734 B2 * | 6/2011 | Hayashi | H01L 21/67248 | 118/724 |
| 7,973,266 B2 * | 7/2011 | Nakajima | H01L 21/67115 | 118/729 |
| 7,988,816 B2 * | 8/2011 | Koshiishi | H01J 37/32834 | 156/345.46 |
| 8,003,919 B2 * | 8/2011 | Goto | H01L 21/6838 | 219/390 |
| 8,193,473 B2 * | 6/2012 | Unno | H05B 3/143 | 118/725 |
| 8,222,574 B2 * | 7/2012 | Sorabji | H01L 21/67115 | 118/725 |
| 8,295,691 B2 * | 10/2012 | Kusuda | H01L 21/67115 | 392/407 |
| 8,349,128 B2 * | 1/2013 | Todorow | C23F 4/00 | 118/723 MR |
| 8,377,207 B2 * | 2/2013 | Kagami | C23C 16/4585 | 118/728 |
| 8,447,177 B2 * | 5/2013 | Kusuda | H05B 1/0227 | 392/407 |
| 8,491,752 B2 * | 7/2013 | Ueda | B32B 38/10 | 156/345.52 |
| 8,608,885 B2 * | 12/2013 | Goto | F27D 5/0037 | 219/448.11 |
| 8,664,116 B2 * | 3/2014 | Fuse | H01L 21/68742 | 257/E21.333 |
| 8,696,862 B2 * | 4/2014 | Sasaki | H01L 21/6831 | 118/724 |
| 8,781,309 B2 * | 7/2014 | Kusuda | H01L 21/68785 | 392/407 |
| 8,787,741 B2 * | 7/2014 | Kato | F27B 17/0025 | 392/416 |
| 8,851,886 B2 * | 10/2014 | Morita | H01L 21/67098 | 118/724 |
| 8,852,966 B2 * | 10/2014 | Kiyama | H01L 21/02337 | 438/795 |
| 8,859,443 B2 * | 10/2014 | Yokouchi | H01L 21/68742 | 392/407 |
| 8,963,050 B2 * | 2/2015 | Kato | H01L 21/67115 | 219/385 |
| 9,082,728 B2 | 7/2015 | Yokouchi | | |
| 9,343,313 B2 * | 5/2016 | Fuse | F27B 17/0025 | |
| 9,449,825 B2 * | 9/2016 | Yokouchi | H01L 21/26 | |
| 9,633,868 B2 * | 4/2017 | Yokouchi | H01L 21/6875 | |
| 9,805,932 B2 * | 10/2017 | Fuse | H01L 21/26513 | |
| 10,557,190 B2 * | 2/2020 | Taga | C23C 4/08 | |
| 10,640,883 B2 * | 5/2020 | Sakamoto | C30B 29/06 | |
| 2002/0066408 A1 * | 6/2002 | Anderson | C30B 25/08 | 118/712 |

(56) References Cited

U.S. PATENT DOCUMENTS

| | | | |
|---|---|---|---|
| 2002/0158060 A1* | 10/2002 | Uchiyama | H05B 3/265 219/444.1 |
| 2002/0175160 A1* | 11/2002 | Bagley | C23C 16/4581 219/400 |
| 2002/0185487 A1* | 12/2002 | Divakar | H05B 3/143 219/468.1 |
| 2002/0186967 A1* | 12/2002 | Ramanan | H01L 21/67109 219/390 |
| 2003/0015515 A1* | 1/2003 | Ito | H01L 21/67109 219/468.1 |
| 2003/0015517 A1* | 1/2003 | Fure | H05B 3/265 219/465.1 |
| 2003/0052118 A1* | 3/2003 | Ramanan | H01L 21/67103 219/444.1 |
| 2003/0094447 A1* | 5/2003 | Yamaguchi | H01L 21/67103 219/468.1 |
| 2003/0136520 A1* | 7/2003 | Yudovsky | C23C 16/4586 118/723 E |
| 2003/0183612 A1* | 10/2003 | Timans | H01L 21/67248 219/390 |
| 2003/0235972 A1 | 12/2003 | Hosokawa | |
| 2004/0011780 A1* | 1/2004 | Sun | H01L 21/67109 219/444.1 |
| 2004/0018361 A1* | 1/2004 | Takahashi | C23C 4/11 428/428 |
| 2004/0040665 A1* | 3/2004 | Mizuno | H02N 13/00 118/728 |
| 2004/0117977 A1* | 6/2004 | Hiramatsu | H01L 21/68757 257/524 |
| 2004/0149719 A1* | 8/2004 | Nakamura | H05B 3/143 219/444.1 |
| 2004/0168641 A1* | 9/2004 | Kuibira | C23C 16/4409 118/728 |
| 2004/0222211 A1* | 11/2004 | Hiramatsu | H01L 21/6833 501/98.4 |
| 2004/0226515 A1* | 11/2004 | Yendler | C23C 16/52 118/728 |
| 2004/0226935 A1* | 11/2004 | Furukawa | H01L 21/67103 219/444.1 |
| 2005/0016471 A1* | 1/2005 | Chiang | C23C 16/4411 118/728 |
| 2005/0098553 A1* | 5/2005 | Devine | H01L 21/67115 219/390 |
| 2005/0103275 A1* | 5/2005 | Sasaki | H01J 37/32706 118/728 |
| 2005/0166848 A1* | 8/2005 | Natsuhara | H01L 21/67103 118/500 |
| 2005/0173396 A1* | 8/2005 | Ooshima | H01L 21/67751 219/390 |
| 2005/0193592 A1 | 9/2005 | Goodman | |
| 2005/0193952 A1* | 9/2005 | Goodman | H01L 21/68735 118/728 |
| 2005/0217585 A1* | 10/2005 | Blomiley | C23C 16/4586 118/728 |
| 2005/0223994 A1* | 10/2005 | Blomiley | C23C 16/52 118/728 |
| 2006/0096972 A1* | 5/2006 | Nakamura | H01L 21/67103 219/544 |
| 2006/0156987 A1* | 7/2006 | Lai | C23C 16/4586 118/728 |
| 2006/0186109 A1* | 8/2006 | Goto | H05B 3/143 219/444.1 |
| 2006/0216665 A1* | 9/2006 | Fukuoka | F27B 5/04 118/58 |
| 2006/0289432 A1* | 12/2006 | Morita | F27B 17/0025 219/390 |
| 2007/0039942 A1* | 2/2007 | Leung | C23C 16/463 219/443.1 |
| 2007/0040265 A1* | 2/2007 | Umotoy | C23C 16/45521 257/704 |
| 2007/0044719 A1* | 3/2007 | Ku | C23C 16/4585 118/728 |
| 2007/0079761 A1* | 4/2007 | Yendler | C23C 16/52 118/728 |
| 2007/0092807 A1* | 4/2007 | Fukushima | G03F 1/32 428/428 |
| 2007/0138601 A1* | 6/2007 | Fan | H01L 21/67103 257/632 |
| 2007/0277735 A1* | 12/2007 | Mokhlesi | H01L 21/3141 118/723 R |
| 2008/0006618 A1* | 1/2008 | Futakuchiya | H05B 3/68 219/444.1 |
| 2008/0008566 A1* | 1/2008 | Endo | H01L 21/67115 392/416 |
| 2008/0017114 A1* | 1/2008 | Watanabe | H01L 21/67115 118/725 |
| 2008/0035306 A1* | 2/2008 | White | C23C 16/463 118/58 |
| 2008/0041312 A1* | 2/2008 | Matsuyama | H01J 37/32706 118/728 |
| 2008/0110874 A1* | 5/2008 | Hayashi | H01L 21/67103 219/468.1 |
| 2008/0170842 A1* | 7/2008 | Hunter | H01L 21/67248 392/416 |
| 2008/0175999 A1* | 7/2008 | Kawaji | H01L 21/6838 118/58 |
| 2008/0190909 A1* | 8/2008 | Yokouchi | H01L 21/324 219/385 |
| 2008/0276869 A1* | 11/2008 | Bader | C23C 16/4583 118/728 |
| 2008/0302781 A1* | 12/2008 | Murakami | C23C 16/4586 219/444.1 |
| 2009/0007841 A1* | 1/2009 | Hirata | C23C 16/4585 118/728 |
| 2009/0031955 A1* | 2/2009 | Lu | C23C 16/4584 279/3 |
| 2009/0032522 A1* | 2/2009 | Salinas | H05B 3/143 219/446.1 |
| 2009/0078694 A1* | 3/2009 | Hayashi | H01L 21/67109 219/444.1 |
| 2009/0103906 A1* | 4/2009 | Kusuda | F27B 17/0025 392/407 |
| 2009/0175605 A1* | 7/2009 | Kobayashi | H01L 21/67115 392/416 |
| 2009/0197403 A1* | 8/2009 | Honda | H01L 21/02326 257/E21.409 |
| 2009/0245761 A1* | 10/2009 | Nakajima | F27B 17/0025 392/416 |
| 2009/0285568 A1* | 11/2009 | Kiyama | H01L 21/67115 392/407 |
| 2010/0133255 A1* | 6/2010 | Bahng | H01L 21/67115 219/526 |
| 2010/0170884 A1* | 7/2010 | Iwata | H01L 21/67109 219/444.1 |
| 2011/0262115 A1* | 10/2011 | Yokouchi | H01L 29/6659 392/407 |
| 2012/0067864 A1* | 3/2012 | Kusuda | H01L 21/67115 219/385 |
| 2012/0174859 A1* | 7/2012 | Sakamoto | C30B 25/12 117/88 |
| 2012/0238110 A1* | 9/2012 | Yokouchi | H01L 21/68785 257/E21.333 |
| 2012/0244725 A1* | 9/2012 | Fuse | H01L 21/26513 257/E21.333 |
| 2012/0288261 A1* | 11/2012 | Hashimoto | F27D 5/0037 392/416 |
| 2012/0288970 A1* | 11/2012 | Hashimoto | H01L 21/67115 257/E21.211 |
| 2013/0078786 A1* | 3/2013 | Fuse | H01L 21/67115 257/E21.241 |
| 2013/0078802 A1* | 3/2013 | Fuse | H01L 21/67115 257/E21.575 |
| 2013/0203269 A1* | 8/2013 | Yokouchi | F27B 5/14 392/416 |
| 2013/0223824 A1* | 8/2013 | Myo | H05B 3/0047 392/416 |
| 2013/0256267 A1* | 10/2013 | Ota | B05C 9/14 156/345.24 |

US 11,881,420 B2

Page 4

(56) References Cited

U.S. PATENT DOCUMENTS

| | | | | |
|---|---|---|---|---|
| 2013/0259457 A1* | 10/2013 | Yokouchi | H01L 21/68785 | 392/416 |
| 2013/0260546 A1* | 10/2013 | Yamada | H01L 21/67115 | 392/416 |
| 2013/0315576 A1* | 11/2013 | Nishihara | H01L 21/67115 | 392/416 |
| 2013/0337661 A1* | 12/2013 | Kato | H01L 21/28185 | 392/416 |
| 2014/0161429 A1* | 6/2014 | Yokouchi | H01L 21/67115 | 392/416 |
| 2014/0169772 A1* | 6/2014 | Abe | H05B 3/0047 | 392/418 |
| 2014/0199056 A1* | 7/2014 | Chang | H01L 21/67115 | 392/416 |
| 2014/0202386 A1* | 7/2014 | Taga | C23C 4/08 | 118/500 |
| 2014/0206108 A1* | 7/2014 | Kiyama | H01L 22/26 | 392/416 |
| 2014/0235072 A1* | 8/2014 | Ito | H01L 21/6875 | 392/416 |
| 2014/0270734 A1* | 9/2014 | Yokouchi | H05B 3/0047 | 392/416 |
| 2014/0319120 A1* | 10/2014 | Brillhart | F27B 17/0025 | 219/405 |
| 2014/0329340 A1* | 11/2014 | Yokouchi | H01L 21/67115 | 392/416 |
| 2015/0037019 A1* | 2/2015 | Collins | H01L 21/67115 | 392/416 |
| 2015/0129586 A1* | 5/2015 | Ikeda | H01L 21/324 | 219/754 |
| 2015/0246405 A1* | 9/2015 | Akama | B23K 1/0016 | 392/416 |
| 2015/0340257 A1* | 11/2015 | Brillhart | H01L 21/67201 | 392/416 |
| 2015/0348809 A1* | 12/2015 | Iu | H01R 33/09 | 392/416 |
| 2015/0348813 A1* | 12/2015 | Mangalore | H01L 21/6833 | 219/634 |
| 2015/0373783 A1* | 12/2015 | Kitagawa | H01L 21/6831 | 156/345.52 |
| 2016/0010239 A1* | 1/2016 | Tong | H05B 3/0047 | 392/416 |
| 2016/0027671 A1* | 1/2016 | Ranish | H01L 21/67115 | 392/416 |
| 2016/0093521 A1* | 3/2016 | Du Bois | H01L 21/68 | 438/795 |
| 2016/0111306 A1* | 4/2016 | Ranish | H05B 3/0047 | 392/419 |
| 2016/0126125 A1* | 5/2016 | Okugawa | H01L 21/67103 | 219/444.1 |
| 2016/0192444 A1* | 6/2016 | Matsushita | H01L 21/67103 | 219/539 |
| 2016/0195333 A1* | 7/2016 | Kawarazaki | H01L 21/02345 | 438/761 |
| 2016/0262207 A1* | 9/2016 | Abe | F27D 11/12 | |
| 2016/0284573 A1* | 9/2016 | Nishide | H05B 1/0233 | |
| 2016/0284575 A1* | 9/2016 | Ito | H01L 21/67115 | |
| 2016/0336195 A1* | 11/2016 | Fuse | H01L 21/324 | |
| 2016/0351424 A1* | 12/2016 | Fuse | F27D 11/12 | |
| 2017/0011922 A1* | 1/2017 | Tanimura | H01L 21/67115 | |
| 2017/0011923 A1* | 1/2017 | Tanimura | H01L 21/67115 | |
| 2017/0053818 A1* | 2/2017 | Aoyama | H01L 21/67248 | |
| 2017/0062223 A1* | 3/2017 | Aoyama | H01L 21/2686 | |
| 2017/0062249 A1* | 3/2017 | Aoyama | H01L 21/28185 | |
| 2017/0117152 A1* | 4/2017 | Aoyama | H01L 21/2253 | |
| 2017/0125312 A1* | 5/2017 | Ono | C23C 14/48 | |
| 2017/0170039 A1* | 6/2017 | Aoyama | H01L 21/67115 | |
| 2017/0178979 A1* | 6/2017 | Furukawa | H05B 1/0233 | |
| 2017/0221736 A1* | 8/2017 | Nishide | F27D 11/00 | |
| 2017/0221749 A1* | 8/2017 | Fuse | H01L 21/68742 | |
| 2017/0243770 A1* | 8/2017 | Abe | H05B 3/0047 | |
| 2017/0243771 A1* | 8/2017 | Abe | H01L 21/67115 | |
| 2018/0005848 A1* | 1/2018 | Aoyama | H01L 21/67207 | |
| 2018/0033628 A1* | 2/2018 | Tanimura | H01L 21/0231 | |
| 2018/0076061 A1* | 3/2018 | Fuse | H01L 21/68742 | |
| 2018/0076062 A1* | 3/2018 | Yamada | H01L 21/67115 | |
| 2018/0077754 A1* | 3/2018 | Ito | G01J 5/602 | |
| 2018/0202071 A1* | 7/2018 | Kawarazaki | H01L 21/02609 | |
| 2018/0240681 A1* | 8/2018 | Ono | H01L 21/6875 | |
| 2018/0240689 A1* | 8/2018 | Kitazawa | H01L 21/681 | |
| 2018/0254224 A1* | 9/2018 | Kitazawa | H01L 21/2686 | |
| 2018/0261477 A1* | 9/2018 | Ito | H01L 21/6719 | |
| 2018/0261478 A1* | 9/2018 | Ueda | G05D 7/0641 | |
| 2018/0261479 A1* | 9/2018 | Ito | H01L 21/67248 | |
| 2018/0269085 A1* | 9/2018 | Fuse | H01L 21/6875 | |
| 2018/0301360 A1* | 10/2018 | Nishide | G02B 5/0231 | |
| 2018/0308726 A1* | 10/2018 | Ito | H01L 21/2686 | |
| 2018/0337076 A1* | 11/2018 | Nishide | H01L 21/6719 | |
| 2018/0337103 A1* | 11/2018 | Omori | H01L 21/67017 | |
| 2018/0358234 A1* | 12/2018 | Ono | H01L 21/67115 | |
| 2019/0006215 A1* | 1/2019 | Aoyama | H01L 21/67115 | |
| 2019/0019697 A1* | 1/2019 | Miyake | H01L 21/67115 | |
| 2019/0027384 A1* | 1/2019 | Nishide | H01L 21/67115 | |
| 2019/0035645 A1* | 1/2019 | Nakajima | H01L 21/67248 | |
| 2019/0084014 A1* | 3/2019 | Furukawa | B08B 5/00 | |
| 2019/0088513 A1* | 3/2019 | Furukawa | H01L 21/68742 | |
| 2019/0141790 A1* | 5/2019 | Ito | H01L 21/67115 | |
| 2019/0157168 A1* | 5/2019 | Kawarazaki | H01L 21/324 | |
| 2019/0164789 A1* | 5/2019 | Aoyama | H01L 21/265 | |
| 2019/0237355 A1* | 8/2019 | Fuse | H01L 21/6875 | |

FOREIGN PATENT DOCUMENTS

| | | |
|---|---|---|
| CN | 103515203 A | 1/2014 |
| CN | 105121693 A | 12/2015 |
| CN | 105762074 A | 7/2016 |
| JP | 2008-182228 A | 8/2008 |
| JP | 2008182228 A | 8/2008 |
| JP | 2010-045113 A | 2/2010 |
| JP | 2011-222739 A | 11/2011 |
| JP | 2012-191110 | 10/2012 |
| JP | 2013-161934 A | 8/2013 |
| JP | 2014-003050 A | 1/2014 |
| JP | 2014003050 A | 1/2014 |
| JP | 2014-135507 A | 7/2014 |
| TW | 201430913 A | 8/2014 |
| TW | 201433643 A | 9/2014 |
| WO | WO 2011/033752 A1 | 3/2011 |
| WO | WO 2014/143141 A1 | 9/2014 |

OTHER PUBLICATIONS

Notification of Granting Patent Right of Invention with Search Report dated Jan. 13, 2022 in corresponding Chinese Patent Application No. 2017106494009. Attached English document is a translation of the official Notification and a partial translation of the Search Report.

First Office Action and Search Report dated Nov. 18, 2020 in corresponding Chinese Patent Application No. 201710649400.9 with Japanese translation and English translation based on the Japanese translation. Portions relevant to prior-art based rejections are translated.

Decision of Refusal dated Oct. 20, 2020 in corresponding Japanese Patent Application No. 2016-179382 with English translation obtained from the JPO.

Notice of Reasons for Refusal dated Jun. 9, 2020 in corresponding Japanese Patent Application No. 2016-179382 with English translation obtained from Global Dossier.

Notice of Reasons for Refusal dated Aug. 11, 2020 in corresponding Japanese Patent Application No. 2016-179382 with English translation obtained from Global Dossier.

Office Action dated Jan. 8, 2018 in counterpart Taiwan Application No. 106118987 with Japanese translation and English partial translation based on the Japanese translation.

Second Office Action and Search Report dated Jun. 23, 2021 in corresponding Chinese Patent Application No. 201710649400.9 with Japanese translation and English translation based on the

(56) References Cited

OTHER PUBLICATIONS

Japanese translation. Portions relevant to prior-art based rejections are translated.

* cited by examiner

F I G . 6
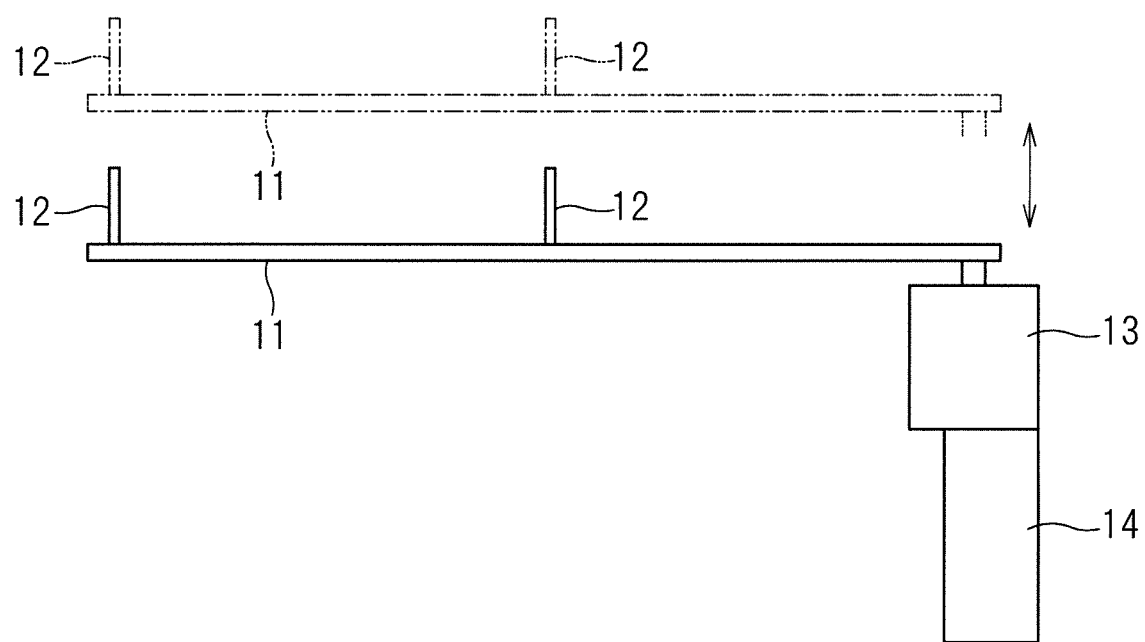

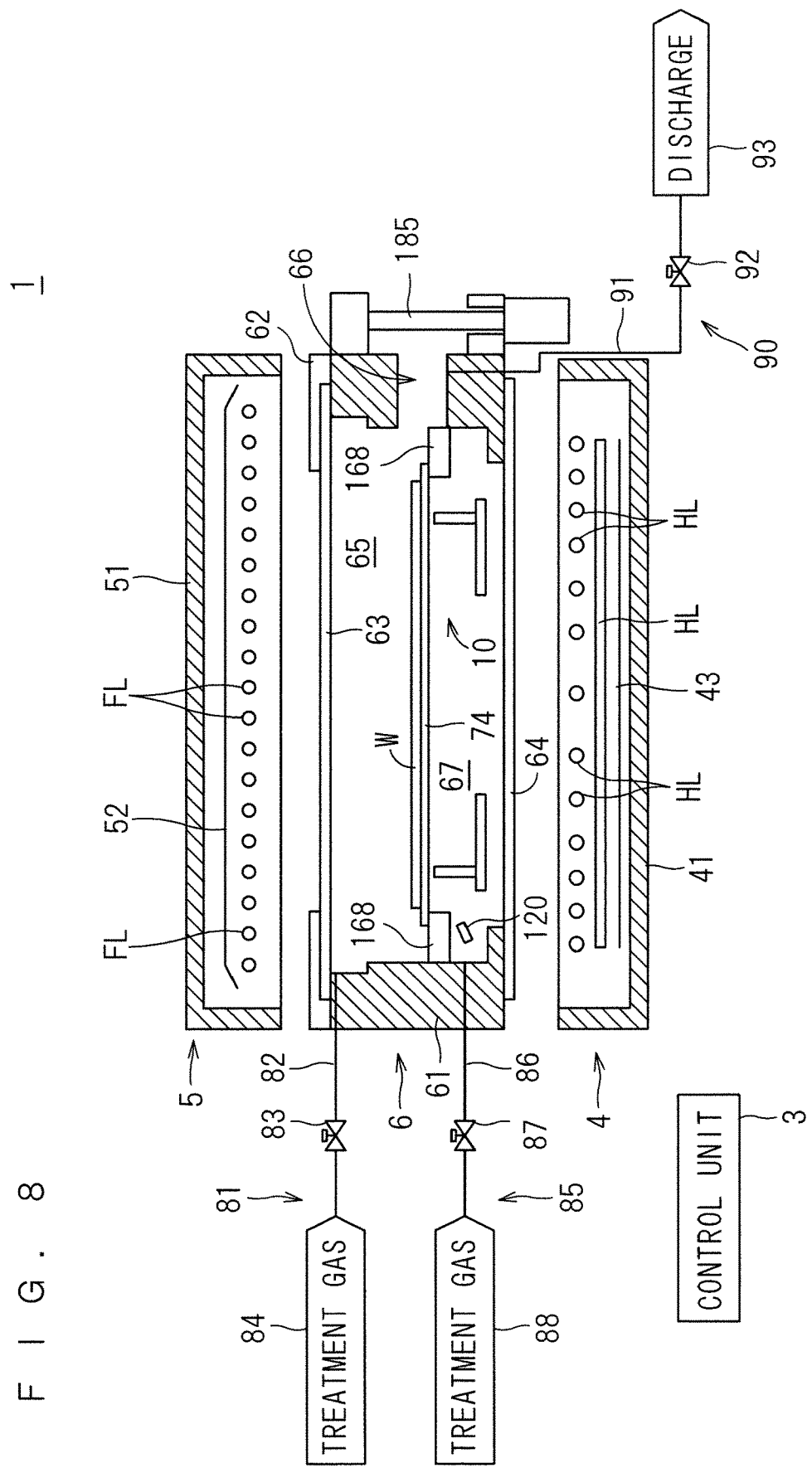

LIGHT-IRRADIATION THERMAL TREATMENT APPARATUS

CROSS-REFERENCE TO RELATED APPLICATIONS

The present patent application is a continuation of U.S. patent application Ser. No. 15/649,052, filed Jul. 13, 2017, by Takahiro YAMADA, Makoto ABE, Kazuhiko FUSE, Jun WATANABE and Shinji MIYAWAKI, entitled "LIGHT-IRRADIATION THERMAL TREATMENT APPARATUS," which claims priority of Japanese Patent Application No. 2016-179382, filed Sep. 14, 2016. The contents of each of the patent applications listed above are incorporated in full herein by reference.

BACKGROUND OF THE INVENTION

Field of the Invention

The present invention relates to a thermal treatment apparatus configured to heat a thin-plate fine electronic substrate (hereinafter simply referred to as a "substrate") such as a semiconductor wafer by irradiating the substrate with light.

Description of the Background Art

In a process of manufacturing a semiconductor device, impurity implantation is a process essential to formation of a pn junction in a semiconductor wafer. Typically, the impurity implantation involves ion injection and annealing thereafter. The ion injection is a technology in which impurity elements such as boron (B), arsenic (As), and phosphorus (P) are ionized and then physically injected through collision into a semiconductor wafer under application of high acceleration voltage. The injected impurities are activated through annealing. If the annealing continues for several seconds or longer, the injected impurities thermally diffuse so deep that the junction is potentially formed at a depth larger than required, which hinders favorable device formation.

To solve this problem, flash lamp annealing (FLA) has recently attracted attention as an annealing technology that heats a semiconductor wafer in an extremely short time. The flash lamp annealing is a thermal treatment technology of increasing the temperature of only the surface of a semiconductor wafer into which impurities are injected, by irradiating the surface of the semiconductor wafer with flash light from a xenon flash lamp (hereinafter simply referring to as "flash lamp" means "xenon flash lamp") in an extremely short time (several milliseconds or less).

The xenon flash lamp has emission spectral distribution ranging from the ultraviolet region to the near-infrared region. The wavelength of light emitted by the xenon flash lamp is shorter than the wavelength of light emitted by a conventional halogen lamp, and substantially matches with the basic absorption band of a semiconductor wafer made of silicon. Thus, when emitted onto the semiconductor wafer by the xenon flash lamp, only a small amount of flash light is transmitted, and thus the temperature of the semiconductor wafer rapidly increases. It is known that irradiation with flash light for an extremely short time of a few milliseconds or less can achieve selective temperature increase only in the vicinity of the surface of the semiconductor wafer. Thus, when the temperature of the surface of the semiconductor wafer is increased for an extremely short time by a xenon flash lamp, only the impurity activation can be executed without deeply diffusing the impurities.

Examples of a thermal treatment apparatus including such a xenon flash lamp include an apparatus configured to perform flash heating on a semiconductor wafer supported on a quartz susceptor, which is a technology disclosed in Japanese Patent Application Laid-open No. 2012-191110. In the apparatus disclosed in Japanese Patent Application Laid-open No. 2012-191110, preheating is performed by irradiating a back surface of the semiconductor wafer being placed on the susceptor with light from a halogen lamp, and then flash heating is performed by irradiating a front surface of the semiconductor wafer with flash light from the flash lamp. In the apparatus disclosed in Japanese Patent Application Laid-open No. 2012-191110, the susceptor is installed such that the susceptor is coupled, through a plurality of coupling members, with a base supported by a chamber housing the semiconductor wafer.

In a thermal treatment apparatus such as that disclosed in Japanese Patent Application Laid-open No. 2012-191110, the semiconductor wafer is housed in the sealed chamber while being subjected to heating treatment, and particles are likely to accumulate on a lower chamber window serving as a floor part of the chamber. Since the flash lamp instantaneously emits high energy flash light, irradiation with this flash light provides impact on the chamber, potentially blowing up the particles accumulated on the lower chamber window. The semiconductor wafer becomes contaminated when the particles blown up by the flash light irradiation adhere to the surface of the semiconductor wafer.

SUMMARY OF THE INVENTION

The present invention is directed to a thermal treatment apparatus configured to heat a substrate by irradiating the substrate with flash light.

A thermal treatment apparatus according to one aspect of the present invention includes: a chamber that houses a substrate; a ring support member attached to an inner wall surface of the chamber; a plate quartz susceptor supported by the support member; and a flash lamp configured to irradiate a substrate supported by the susceptor with flash light.

The chamber is separated into two spaces of upper and lower spaces, and thus the substrate can be prevented from being contaminated by particles blown up in the lower space at flash light irradiation and adhering to a surface of the substrate.

Preferably, the support member has a mirrored inner peripheral surface.

Flash light emitted by the flash lamp reaches the surface of the substrate after reflected by the inner peripheral surface of the support member. Accordingly, the temperature of the surface of the substrate can be further increased.

The present invention is thus intended to prevent contamination of a substrate irradiated with flash light.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a side view of the transfer mechanism;

FIG. 8 is a diagram illustrating another exemplary support.

DESCRIPTION OF THE PREFERRED EMBODIMENTS

Preferred embodiments of the present invention will be described in detail below with reference to the accompanying drawings.

Figure 1:
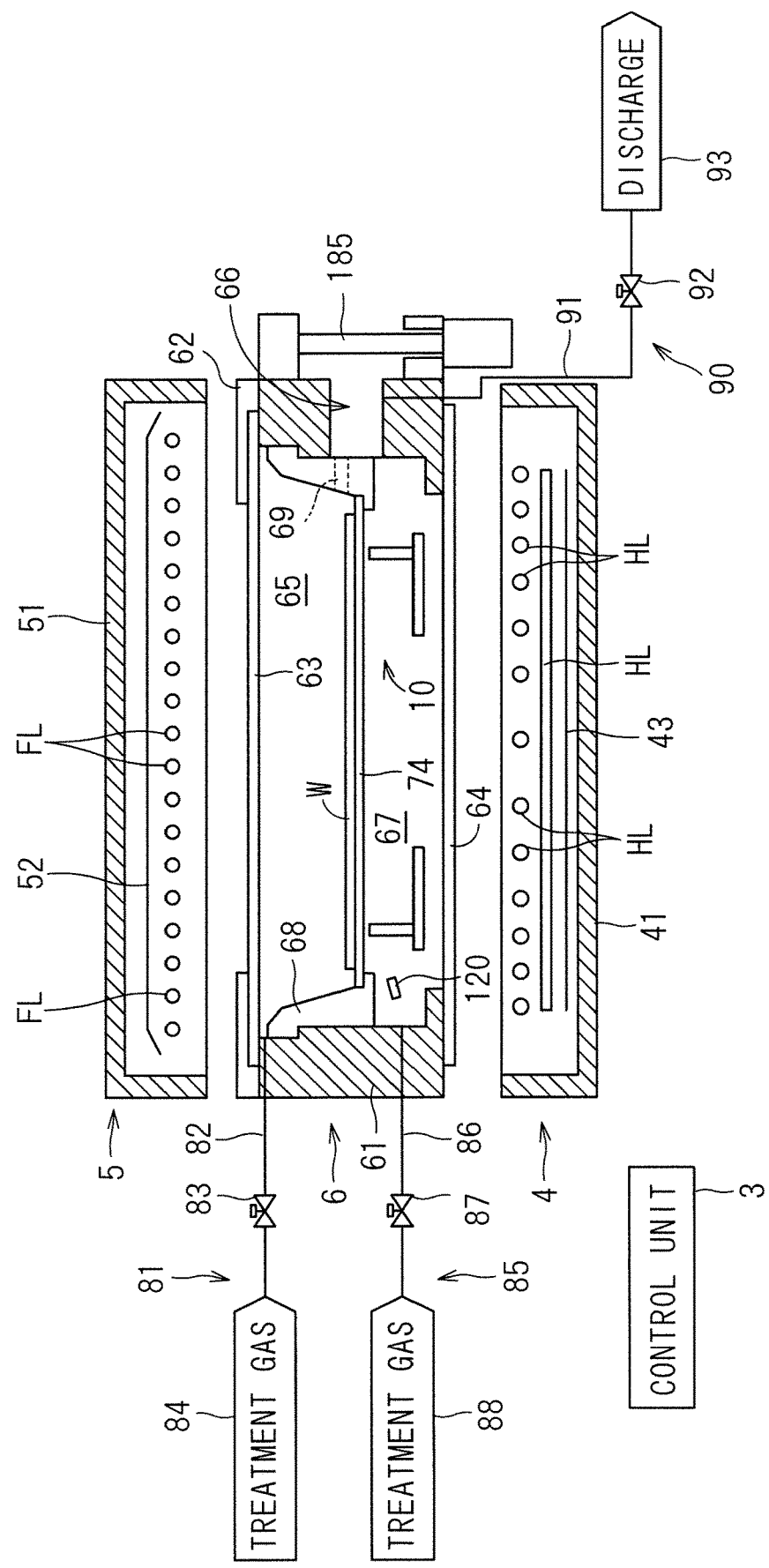
FIG. 1 is a longitudinal sectional view illustrating the configuration of a thermal treatment apparatus according to the present invention.

FIG. 1 is a longitudinal sectional view illustrating the configuration of a thermal treatment apparatus 1 according to the present invention. The thermal treatment apparatus 1 according to the present preferred embodiment is a flash lamp annealer device configured to heat a semiconductor wafer W as a substrate having a circular disk shape by irradiating the semiconductor wafer W with flash light. The diameter size of the semiconductor wafer W to be treated is not particularly limited, but may be, for example, 300 mm or 450 mm. In FIG. 1 and the other drawings described below, the dimension of each component and the number thereof are exaggerated or simplified as necessary to facilitate understanding.

The thermal treatment apparatus 1 includes a chamber 6 that houses the semiconductor wafer W, a flash heating unit 5 including a plurality of built-in flash lamps FL, and a halogen heating unit 4 including a plurality of built-in halogen lamps HL. The flash heating unit 5 is provided above the chamber 6, and the halogen heating unit 4 is provided below the chamber 6. The thermal treatment apparatus 1 also includes, inside the chamber 6, a susceptor 74 configured to hold the semiconductor wafer W in a horizontal posture, and a transfer mechanism 10 configured to transfer the semiconductor wafer W between the susceptor 74 and the outside of the apparatus. The thermal treatment apparatus 1 also includes a control unit 3 configured to execute thermal treatment on the semiconductor wafer W by controlling operation mechanisms provided to the halogen heating unit 4, the flash heating unit 5, and the chamber 6.

The chamber 6 includes a tubular chamber side portion 61 and quartz chamber windows mounted on upper and lower parts of the chamber side portion 61. The chamber side portion 61 has a schematically tube shape with openings at the upper and lower parts, the upper opening being blocked with an upper chamber window 63, and the lower opening being blocked with a lower chamber window 64. The upper chamber window 63 as a ceiling part of the chamber 6 is a circular-disk shaped member made of quartz, and functions as a quartz window that transmits, into the chamber 6, flash light emitted by the flash heating unit 5. The upper chamber window 63 is mounted onto the chamber 6 by fixing the clamp ring 62 to the chamber side portion 61 through a screw while an O ring is placed between a peripheral part of a lower surface of the upper chamber window 63 and the chamber side portion 61 and a clamp ring 62 is made contact with a peripheral part of an upper surface of the upper chamber window 63. The lower chamber window 64 serving as a floor part of the chamber 6 is a circular-disk shaped member made of quartz, and functions as a quartz window that transmits, into the chamber 6, light emitted by the halogen heating unit 4.

Figure 2:
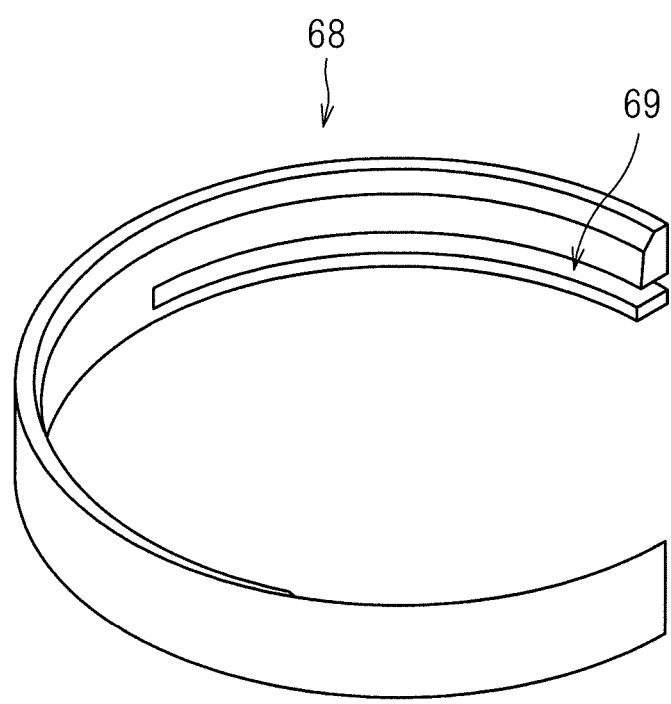
FIG. 2 is a perspective view of a support.

A ring support 68 is attached to an inner wall surface of the chamber side portion 61. FIG. 2 is a perspective view of the support 68. The support 68 has a circular ring shape. FIG. 2 illustrates a perspective view of part of the support 68 for understanding of a sectional shape of the support 68. The support 68 is mounted by being inset from above the chamber side portion 61. In other words, the support 68 is detachably attached to an inner wall surface of the chamber 6. When mounted on the chamber 6 as illustrated in FIG. 1, the ring support 68 covers an upper part of the inner wall surface of the chamber 6.

The support 68 is made of aluminum or stainless steel. The support 68 has an inner peripheral surface mirrored by electrolytic nickel plating. A slit 69 is provided to part of the support 68 along a circumferential direction thereof.

Figure 3:
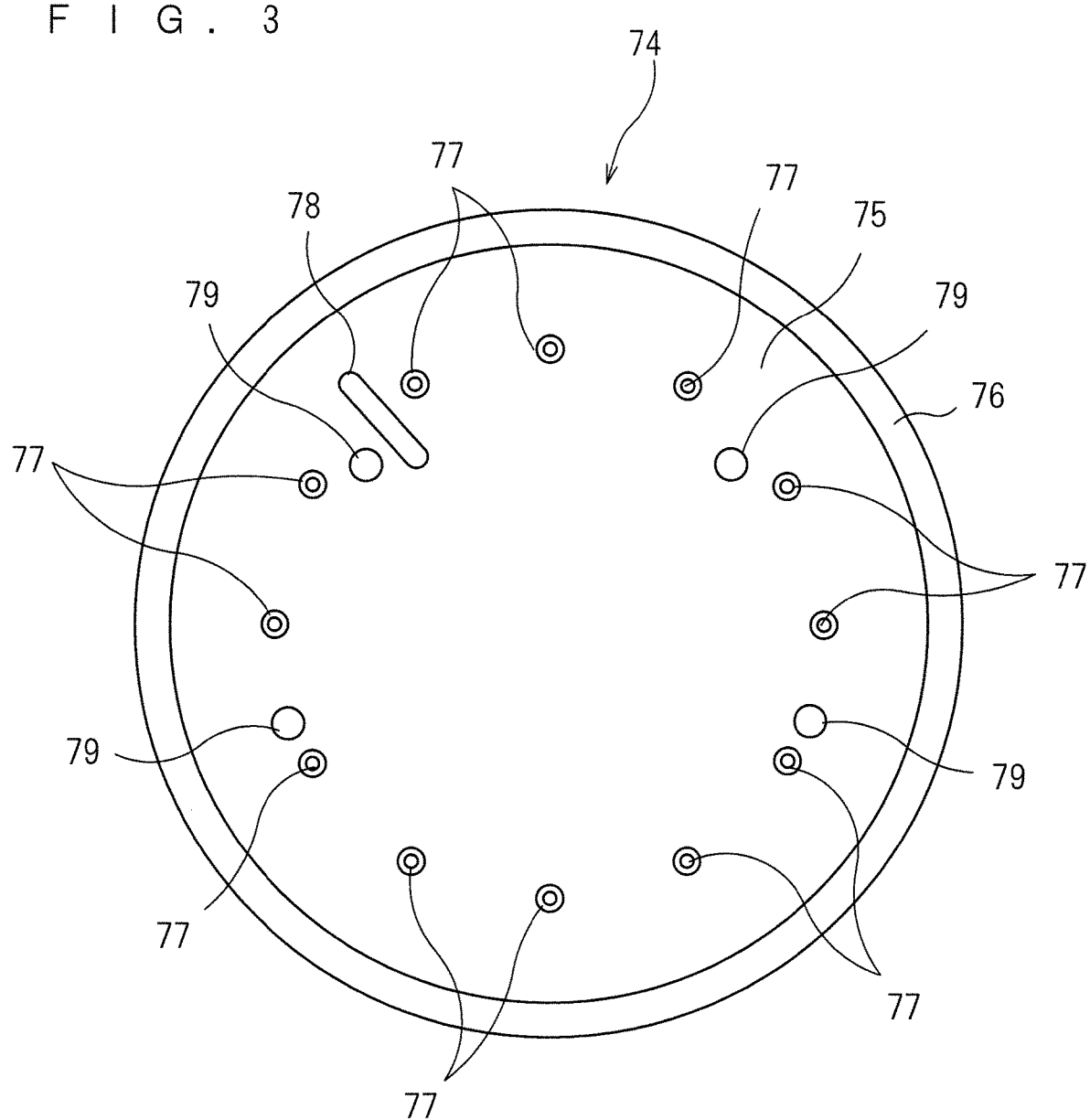
FIG. 3 is a plan view of a susceptor.
Figure 4:
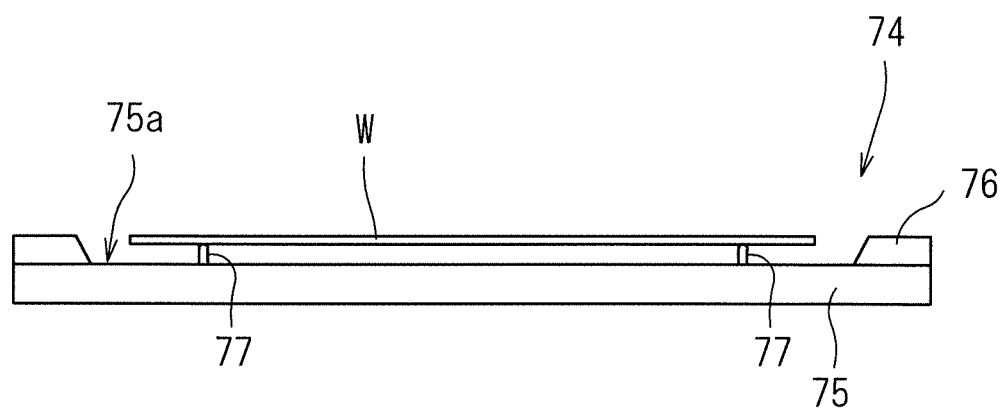
FIG. 4 is a cross-sectional view of the susceptor.

As illustrated in FIG. 1, a peripheral part of the susceptor 74 is supported by a flange provided as an extension at a lower end of an inner periphery of the support 68. Specifically, the susceptor 74 is supported being suspended by the support 68. FIG. 3 is a plan view of the susceptor 74. FIG. 4 is a cross-sectional view of the susceptor 74. The susceptor 74 includes a holding plate 75, a guide ring 76, and a plurality of substrate supporting pins 77. The holding plate 75 is a substantially circular flat plate member made of quartz. The holding plate 75 has a diameter larger than that of the semiconductor wafer W. In other words, the holding plate 75 has a plane size larger than that of the semiconductor wafer W.

The guide ring 76 is installed at a peripheral part of an upper surface of the holding plate 75. The guide ring 76 is shaped in a circular ring having an inner diameter larger than the diameter of the semiconductor wafer W. For example, when the semiconductor wafer W has a diameter of φ300 mm, the guide ring 76 has an inner diameter of φ320 mm. The guide ring 76 has an inner periphery of a tapering surface spreading upward from the holding plate 75. The guide ring 76 is made of quartz like the holding plate 75. The guide ring 76 may be welded to the upper surface of the holding plate 75 or may be fixed to the holding plate 75 through, for example, a separately fabricated pin. Alternatively, the holding plate 75 and the guide ring 76 may be integrally fabricated.

A plane holding surface 75a on which the semiconductor wafer W is held is a region inside the guide ring 76 on the upper surface of the holding plate 75. The plurality of substrate supporting pins 77 are erected on the holding surface 75a of the holding plate 75. In the present preferred embodiment, a total of twelve substrate supporting pins 77 are erected on the circumference of a circle concentric with an outer peripheral circle of the holding surface 75a (inner peripheral circle of the guide ring 76) and separated from each other by 30°. The circle on which the twelve substrate supporting pins 77 are disposed has a diameter (distance between each pair of the facing substrate supporting pins 77) that is smaller than that of the semiconductor wafer W and is, for example, φ270 mm to φ280 mm (in the present preferred embodiment, φ280 mm) when the semiconductor wafer W has a diameter of φ300 mm. The substrate supporting pins 77 are made of quartz. The plurality of substrate supporting pins 77 may be provided on the upper surface of the holding plate 75 by welding or may be fabricated integrally with the holding plate 75.

When the substantially flat plate susceptor 74 is supported by the support 68 mounted on the chamber 6, the holding plate 75 of the susceptor 74 is in a horizontal posture (in which the normal thereof aligns with a vertical direction). In other words, the holding surface 75a of the holding plate 75 is a horizontal plane.

When conveyed into the chamber 6, the semiconductor wafer W is placed and held in a horizontal posture on the susceptor 74. When held on the susceptor 74, the semiconductor wafer W is supported by the twelve substrate supporting pins 77 erected on the holding plate 75. More precisely, upper end parts of the twelve substrate supporting pins 77 are in contact with a lower surface of the semiconductor wafer W, supporting the semiconductor wafer W. The twelve substrate supporting pins 77 have uniform heights (distance between an upper end of each substrate supporting pin 77 and the holding surface 75a of the holding plate 75), and thus the semiconductor wafer W can be supported in the horizontal posture by the twelve substrate supporting pins 77.

The plurality of substrate supporting pins 77 support the semiconductor wafer W at a position separated from the holding surface 75a of the holding plate 75 by a predetermined interval. The guide ring 76 has a thickness larger than the heights of the substrate supporting pins 77. With this configuration, the guide ring 76 prevents a horizontal positional shift of the semiconductor wafer W supported by the plurality of substrate supporting pins 77.

In the present preferred embodiment, since the semiconductor wafer W is supported by the circular-disk shaped susceptor 74 supported by the ring support 68, the semiconductor wafer W is surrounded by a structure symmetric with respect to the center of the wafer.

As illustrated in FIG. 1, the chamber 6 has two vertically separated spaces while the susceptor 74 is supported by the support 68 attached to the inner wall surface of the chamber 6. An upper space 65 is defined to be a space surrounded by the upper chamber window 63, the susceptor 74, and the support 68. A lower space 67 is defined to be a space surrounded by the lower chamber window 64, the susceptor 74, and the chamber side portion 61.

As illustrated in FIG. 3, a vertical opening 78 is formed in the holding plate 75 of the susceptor 74. The opening 78 is provided to allow a radiation thermometer 120 (refer to FIG. 1) to receive radiation light (infrared light) emitted from the back surface of the semiconductor wafer W held by the susceptor 74. Specifically, the radiation thermometer 120 receives infrared light emitted from the back surface of the semiconductor wafer W held by the susceptor 74 through the opening 78, and a separately provided detector measures the temperature of the semiconductor wafer W. Four through-holes 79 are drilled through the holding plate 75 of the susceptor 74. Lift pins 12 of the transfer mechanism 10 to be described later penetrate through the through-holes 79 for transferring the semiconductor wafer W.

Referring to FIG. 1 again, the chamber side portion 61 is provided with a conveyance opening (throat) 66 through which the semiconductor wafer W is conveyed into and out of the chamber 6. The conveyance opening 66 can be opened and closed through a gate valve 185. The slit 69 of the support 68 described above is provided at a position facing to the conveyance opening 66. In other words, the support 68 is attached to the inner wall surface of the chamber 6 such that the slit 69 faces to the conveyance opening 66. When the conveyance opening 66 is opened through the gate valve 185, the semiconductor wafer W can be conveyed into the upper space 65 through the conveyance opening 66 and the slit 69 of the support 68. The semiconductor wafer W can be conveyed out of the upper space 65 through the slit 69 and the conveyance opening 66. When the conveyance opening 66 is closed through the gate valve 185, the upper space 65 and the lower space 67 inside the chamber 6 are enclosed spaces.

The thermal treatment apparatus 1 includes a first gas supplying mechanism 81 and a second gas supplying mechanism 85 configured to supply treatment gas to the upper space 65 and the lower space 67, respectively. The first gas supplying mechanism 81 includes a gas supplying tube 82, a valve 83, and a first treatment-gas supplying source 84. The gas supplying tube 82 has a leading end communicated and connected with the upper space 65 through a gap between an upper end of the support 68 and the upper chamber window 63, and has a base end connected with the first treatment-gas supplying source 84. The valve 83 is interposed halfway through the gas supplying tube 82. When the valve 83 is opened, the treatment gas is supplied from the first treatment-gas supplying source 84 to the upper space 65 through the gas supplying tube 82.

The second gas supplying mechanism 85 includes a gas supplying tube 86, a valve 87, and a second treatment-gas supplying source 88. The gas supplying tube 86 has a leading end communicated and connected with the lower space 67 below the support 68, and has a base end connected with the second treatment-gas supplying source 88. The valve 87 is interposed halfway through the gas supplying tube 86. When the valve 87 is opened, the treatment gas is supplied from the second treatment-gas supplying source 88 to the lower space 67 through the gas supplying tube 86. The treatment gas supplied by the first gas supplying mechanism 81 and the second gas supplying mechanism 85 may be inert gas such as nitrogen ($N_2$), or reactive gas such as hydrogen ($H_2$) and ammonia ($NH_3$).

The thermal treatment apparatus 1 includes a discharge mechanism 90 configured to discharge gas from the upper space 65 and the lower space 67. The discharge mechanism 90 includes a discharge pipe 91, a valve 92, and a discharge unit 93. The discharge pipe 91 has a leading end communicated and connected with the conveyance opening 66, and has a base end connected with the discharge unit 93. The valve 92 is interposed halfway through the discharge pipe 91. The discharge unit 93 may be, for example, a discharge pump. When the valve 92 is opened while the discharge unit 93 is actuated, gas in the upper space 65 is discharged to the discharge pipe 91 through the slit 69 of the support 68 and the conveyance opening 66. Gas in the lower space 67 is also discharged from the conveyance opening 66 to the discharge pipe 91. In other words, the first gas supplying mechanism 81 and the second gas supplying mechanism 85 are air supplying mechanism dedicated to the upper space 65 and the lower space 67, respectively, whereas the discharge mechanism 90 is a mechanism shared by the first gas supplying mechanism 81 and the second gas supplying mechanism 85.

Figure 5:
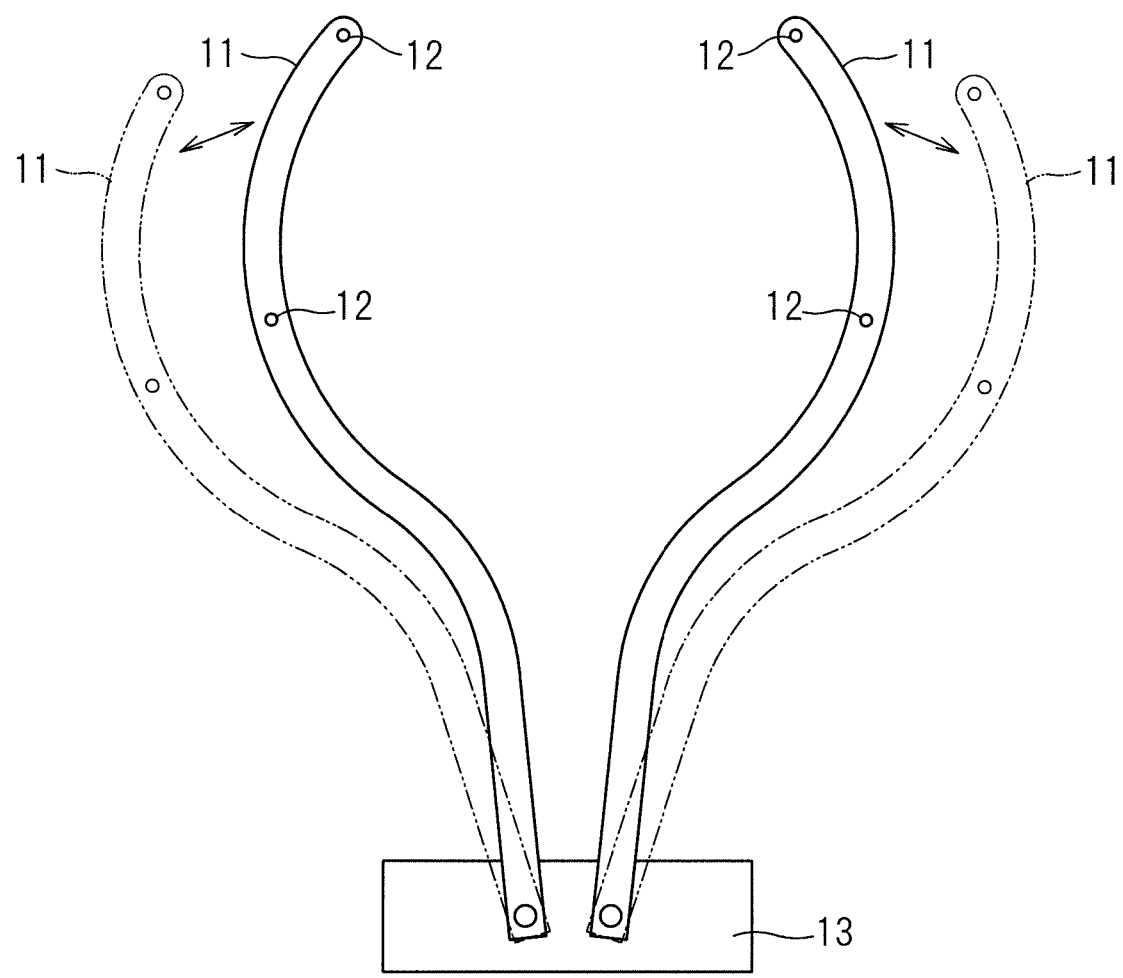
FIG. 5 is a plan view of a transfer mechanism.

FIG. 5 is a plan view of the transfer mechanism 10. FIG. 6 is a side view of the transfer mechanism 10. The transfer mechanism 10 includes two transfer arms 11. The transfer arms 11 have arc shapes along an inner wall of the substantially circular ring chamber side portion 61. Two of the lift pins 12 are erected on each transfer arm 11. The transfer arms 11 can be rotated by a horizontal movement mechanism 13. The horizontal movement mechanism 13 horizontally moves each of the transfer arms 11 in a pair between a transfer operation position (illustrated with solid lines in FIG. 5) for transferring the semiconductor wafer W to the susceptor 74 and a retracted position (illustrated with dashed and double-dotted lines in FIG. 5) for avoiding overlapping between the transfer arm 11 and the semiconductor wafer W held by the susceptor 74 in plan view. The horizontal movement mechanism 13 may be configured to rotate each transfer arm 11 through an individual motor or rotate the pair of the transfer arms 11 in a coupled manner through a single motor by using a link mechanism.

The pair of the transfer arms 11 is vertically moved together with the horizontal movement mechanism 13 by an elevation mechanism 14. When the elevation mechanism 14 moves up the pair of the transfer arms 11 at the transfer operation position, a total of four of the lift pins 12 pass through the through-holes 79 (refer to FIG. 3) drilled through the susceptor 74, and upper ends of the lift pins 12 protrude out of an upper surface of the susceptor 74. When the elevation mechanism 14 moves down the pair of the transfer arms 11 at the transfer operation position to remove the lift pins 12 from the through-holes 79, and the horizontal movement mechanism 13 opens the pair of the transfer arms 11, the transfer arms 11 move to the retracted position. The retracted position of the pair of the transfer arms 11 is below the support 68. A discharge mechanism (not illustrated) is provided near sites where drive units (the horizontal movement mechanism 13 and the elevation mechanism 14) of the transfer mechanism 10 are provided, and is configured to discharge atmosphere around the drive units of the transfer mechanism 10 outside the chamber 6.

Referring to FIG. 1 again, the flash heating unit 5 provided above the chamber 6 includes, inside a housing 51, a light source including a plurality (in the present preferred embodiment, 30) of xenon flash lamps FL, and a reflector 52 provided to cover over the light source. Flash light emitted by the flash lamps FL transmits through the upper chamber window 63 and enters into the upper space 65.

The plurality of flash lamps FL are each a bar lamp having a long cylindrical shape, and are arrayed in a plane such that longitudinal directions thereof are parallel to each other along a main surface of the semiconductor wafer W held by the susceptor 74 (along a horizontal direction). Thus, the plane formed by the array of the flash lamps FL is a horizontal plane.

The xenon flash lamps FL each include a bar glass tube (discharge tube) in which xenon gas is encapsulated and at both end parts of which an anode and a cathode are disposed and connected with a capacitor, and a trigger electrode attached onto an outer peripheral surface of the glass tube. Since xenon gas is an electrical insulator, no electricity flows in the glass tube in a normal state while electric charge is accumulated in the capacitor. However, when high voltage is applied to the trigger electrode to break down insulation, electricity accumulated in the capacitor instantaneously flows into the glass tube, and light is emitted through excitation of xenon atoms or molecules. In the xenon flash lamps FL thus configured, electrostatic energy accumulated in the capacitor in advance is converted into an extremely short light pulse of 0.1 millisecond to 100 milliseconds. Thus, the xenon flash lamps FL are capable of performing irradiation with extremely intensive light as compared to a continuously turned-on light source such as the halogen lamps HL. In other words, the flash lamps FL are pulsed light emission lamps configured to instantaneously emit light in an extremely short time less than one second. The time of light emission by the flash lamps FL can be adjusted through the coil constant of a lamp power source configured to supply electrical power to the flash lamps FL.

The reflector 52 is provided above the plurality of flash lamps FL to entirely cover the flash lamps FL. The reflector 52 basically reflects flash light emitted by the plurality of flash lamps FL toward the chamber 6. The reflector 52 is formed of an aluminum alloy plate and has a surface (toward the flash lamps FL) roughened by blast treatment.

The halogen heating unit 4 provided below the chamber 6 includes, inside a housing 41, a plurality (in the present preferred embodiment, 40) of the halogen lamps HL. The halogen heating unit 4 is a light irradiation unit configured to heat the semiconductor wafer W by performing irradiation with light from the plurality of halogen lamps HL through the lower chamber window 64 from below the chamber 6.

Figure 7:
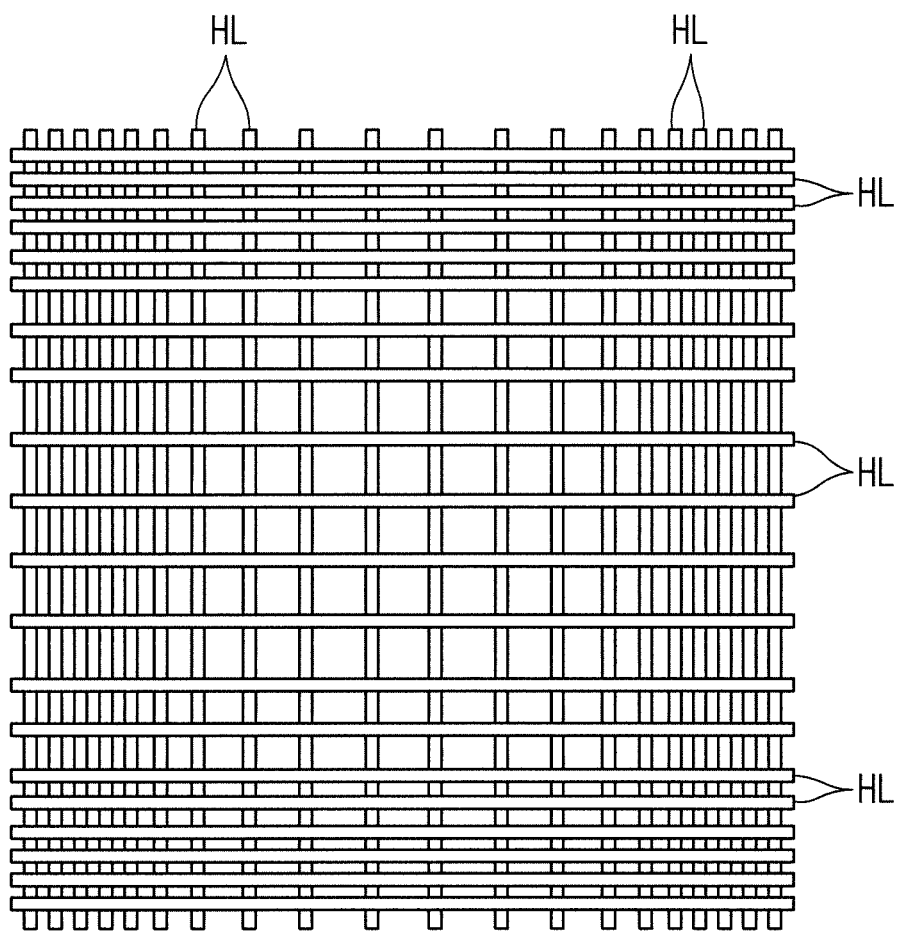
FIG. 7 is a plan view illustrating arrangement of a plurality of halogen lamps.

FIG. 7 is a plan view illustrating arrangement of the plurality of halogen lamps HL. The 40 halogen lamps HL are arranged in upper and lower parts. Twenty of the halogen lamps HL are arranged in the upper part closer to the chamber 6, and the other twenty halogen lamps HL are arranged in the lower part farther apart from the chamber 6 than the upper part. The halogen lamps HL are each a bar lamp having a long cylindrical shape. The twenty halogen lamps HL in each of the upper and lower parts are arrayed such that longitudinal directions thereof are parallel to each other along the main surface of the semiconductor wafer W held by the susceptor 74 (along the horizontal direction). Thus, in each of the upper and lower parts, a plane formed by the array of the halogen lamps HL is a horizontal plane.

As illustrated in FIG. 7, in each of the upper and lower parts, the halogen lamps HL are arranged more densely in a region facing to a peripheral part of the semiconductor wafer W held by the susceptor 74 than in a region facing to a central part of the semiconductor wafer W. In other words, in each of the upper and lower parts, the halogen lamps HL are arranged at shorter pitches in the peripheral part of the lamp array than in the central part thereof. Thus, at heating through irradiation with light from the halogen heating unit 4, irradiation with a larger quantity of light can be performed at the peripheral part of the semiconductor wafer W where temperature decrease is likely to occur.

The halogen lamps HL in the upper and lower parts are arrayed in a lattice shape such that the halogen lamps HL in the upper part intersect with the halogen lamps HL in the lower part. In other words, the 40 halogen lamps HL are arranged such that the longitudinal directions of the twenty halogen lamps HL arranged in the upper part are orthogonal to each other the longitudinal directions of the twenty halogen lamps HL arranged in the lower part.

The halogen lamps HL are each a filament light source configured to emit light by heating a filament disposed inside the glass tube to be incandescent through energization to the filament. The glass tube encapsulates inert gas, such as nitrogen or argon, containing a small amount of halogen element (for example, iodine or bromine). The halogen element allows setting of the temperature of the filament to a high temperature while reducing damage on the filament. Thus, each halogen lamp HL has a longer lifetime and can continuously emit more intensive light as compared to a normal filament lamp. In other words, the halogen lamps HL are continuously turned-on lamps configured to continuously emit light for at least one second. Moreover, being bar lamps, the halogen lamps HL have long lifetime. When the halogen lamps HL are arranged along the horizontal direction, an excellent efficiency of emission to the semiconductor wafer W above can be obtained.

A reflector 43 is provided below the halogen lamps HL in the two parts in the housing 41 of the halogen heating unit 4 (FIG. 1). The reflector 43 reflects light emitted by the plurality of halogen lamps HL toward the chamber 6.

The control unit 3 controls the above-described various kinds of operation mechanisms provided to the thermal treatment apparatus 1. The control unit 3 has a hardware configuration similar to that of a typical computer. Specifically, the control unit 3 includes a CPU as a circuit configured to perform various kinds of arithmetic processing, a ROM as a read-only memory storing a basic program, a RAM as a readable/writable memory storing various kinds of information, and a magnetic disk storing, for example, control software and data. Treatment at the thermal treatment apparatus 1 proceeds as the CPU of the control unit 3 executes a predetermined treatment program.

In addition to the above-described components, the thermal treatment apparatus 1 includes various cooling structures to prevent excessive temperature increase at the halogen heating unit 4, the flash heating unit 5, and the chamber 6 due to thermal energy generated by the halogen lamps HL and the flash lamps FL at thermal treatment of the semiconductor wafer W. For example, a water-cooling tube (not illustrated) is provided on a wall of the chamber 6. The halogen heating unit 4 and the flash heating unit 5 each have an air cooling structure that removes heat by forming gas flow inside.

The following describes a procedure of treatment on the semiconductor wafer W at the thermal treatment apparatus 1. The semiconductor wafer W to be treated is a semiconductor substrate to which impurities (ions) are added by an ion injection technique. The impurities are activated through flash light irradiation thermal treatment (annealing) by the thermal treatment apparatus 1. The procedure of treatment on the thermal treatment apparatus 1 described below proceeds as the control unit 3 controls each operation mechanism of the thermal treatment apparatus 1.

First, the gate valve 185 is opened to leave the conveyance opening 66 open, and then the semiconductor wafer W is conveyed into the chamber 6 through the conveyance opening 66 by a conveyance robot outside the apparatus. The conveyance robot inserts a conveyance arm holding the semiconductor wafer W into the upper space 65 through the conveyance opening 66 and the slit 69 of the support 68. The conveyance robot proceeds the conveyance arm to a position directly above the susceptor 74 and stops the conveyance arm. Then, as the pair of the transfer arms 11 of the transfer mechanism 10 is horizontally moved from the retracted position to the transfer operation position and moved up, the lift pins 12 protrude out of the holding plate 75 of the upper surface of the susceptor 74 through the through-holes 79 to receive the semiconductor wafer W from the conveyance arm. In this state, the lift pins 12 are raised to be higher than the upper ends of the substrate supporting pins 77.

After the semiconductor wafer W is placed on the lift pins 12, the conveyance robot removes the conveyance arm, which is now holding nothing, from the upper space 65 through the slit 69 and the conveyance opening 66, and thereafter the conveyance opening 66 is closed through the gate valve 185. Then, as the pair of the transfer arms 11 is moved down, the semiconductor wafer W is transferred from the transfer mechanism 10 to the susceptor 74 and held in a horizontal posture from below. Being held by the susceptor 74, the semiconductor wafer W is supported by the plurality of substrate supporting pins 77 erected on the holding plate 75. A front surface of the semiconductor wafer W being supported by the susceptor 74, which is patterned and to which impurities are injected, faces upward. A predetermined interval is provided between a back surface (main surface opposite to the front surface that is patterned and to which the impurities are injected) of the semiconductor wafer W supported by the plurality of substrate supporting pins 77 and the holding surface 75a of the holding plate 75. When moved down below the susceptor 74, the pair of the transfer arms 11 is retracted to the retracted position by the horizontal movement mechanism 13.

After the conveyance opening 66 is closed through the gate valve 185 to seal the upper space 65, atmosphere inside the chamber 6 is adjusted. Specifically, the valve 83 is opened to supply treatment gas from the first gas supplying mechanism 81 into the upper space 65, and the valve 87 is opened to supply treatment gas from the second gas supplying mechanism 85 into the lower space 67. In the present preferred embodiment, nitrogen is the treatment gas supplied to the upper space 65 and the lower space 67 by the first gas supplying mechanism 81 and the second gas supplying mechanism 85.

Simultaneously, the valve 92 is opened to discharge the gas inside the upper space 65 and the lower space 67. Accordingly, the insides of the upper space 65 and the lower space 67 are replaced with a nitrogen atmosphere. In addition, the discharge mechanism (not illustrated) discharges atmosphere around the drive units of the transfer mechanism 10.

After the insides of the upper space 65 and the lower space 67 are replaced with the nitrogen atmosphere and the semiconductor wafer W is supported in a horizontal posture from below by the susceptor 74, the 40 halogen lamps HL of the halogen heating unit 4 are turned on at once to start preheating (assist heating). Halogen light emitted by the halogen lamps HL transmits through the lower chamber window 64 and the susceptor 74 made of quartz and is incident on the back surface of the semiconductor wafer W. The semiconductor wafer W is preheated through reception of the irradiation light from the halogen lamps HL, and accordingly the temperature of the semiconductor wafer W increases. The transfer arms 11 of the transfer mechanism 10, which are being retracted at the retracted position, do not interfere the heating with the halogen lamps HL.

At the preheating with the halogen lamps HL, the radiation thermometer 120 measures the temperature of the semiconductor wafer W. Specifically, the radiation thermometer 120 measures the increasing temperature of the wafer by receiving infrared light emitted through the opening 78 from the back surface of the semiconductor wafer W held by the susceptor 74. The measured temperature of semiconductor wafer W is notified to the control unit 3. The control unit 3 controls outputs of the halogen lamps HL while monitoring whether the temperature of the semiconductor wafer W, which increases through irradiation with light from the halogen lamps HL, has reached a predetermined preheating temperature T1. Specifically, the control unit 3 performs, based on a value measured by the radiation thermometer 120, feedback control of the outputs of the halogen lamps HL so that the temperature of the semiconductor wafer W becomes equal to the preheating temperature T1. The preheating temperature T1 is between 200° C. to 800° C. approximately, preferably between 350° C. to 600° C. approximately (in the present preferred embodiment, 600° C.).

After the temperature of the semiconductor wafer W has reached at the preheating temperature T1, the control unit 3 temporarily maintains the semiconductor wafer W at the preheating temperature T1. Specifically, when the temperature of the semiconductor wafer W measured by the radiation thermometer 120 has reached the preheating temperature T1, the control unit 3 adjusts the outputs of the halogen lamps HL to maintain the temperature of the semiconductor wafer W substantially at the preheating temperature T1.

The temperature of the entire semiconductor wafer W is uniformly increased to the preheating temperature T1 through the preheating with the halogen lamps HL. At the stage of the preheating with the halogen lamps HL, the temperature of the semiconductor wafer W tends to decrease by a larger amount at the peripheral part thereof, from which heat is more likely to be released, than at the central part thereof. However, since the halogen lamps HL of the halogen heating unit 4 are arranged more densely in the region facing to the peripheral part of the semiconductor wafer W than in the region facing to the central part thereof, a larger quantity of light is incident on the peripheral part of the semiconductor wafer W, from which heat is likely to be released. With this configuration, the semiconductor wafer W at the preheating stage can have uniform in-plane temperature distribution.

When a predetermined time has elapsed since the temperature of the semiconductor wafer W reached the preheating temperature T1, the flash lamps FL of the flash heating unit 5 irradiate the front surface of the semiconductor wafer W with flash light. In this case, part of the flash light emitted by the flash lamps FL travels directly into the chamber 6, and the other part thereof travels into the chamber 6 after temporarily reflected by the reflector 52. Flash heating of the semiconductor wafer W is performed through irradiation with these parts of the flash light.

Since the flash heating is performed through irradiation with the flash light from the flash lamps FL, the temperature of the front surface of the semiconductor wafer W can be increased in a short time. Specifically, the flash light emitted by the flash lamps FL is extremely short and intensive flash light having an irradiation time of 0.1 millisecond to 100 milliseconds approximately. This flash light is generated through conversion of electrostatic energy stored in the capacitor in advance into an extremely short light pulse. Then, the temperature of the front surface of the semiconductor wafer W, which is subjected to the flash heating through irradiation with the flash light from the flash lamps FL, instantaneously increases to a treatment temperature T2 of 1000° C. or higher at which the impurities injected in the semiconductor wafer W are activated. Thereafter, the temperature of the front surface rapidly decreases. In this manner, the thermal treatment apparatus 1 can increase and decrease the temperature of the front surface of the semiconductor wafer W in an extremely short time, and thus the impurities injected in the semiconductor wafer W can be activated while being prevented from thermally diffusing. A time necessary for the activation of the impurities is extremely short as compared to a time necessary for the thermal diffusion thereof, and thus the activation is completed in a short time of 0.1 millisecond to 100 milliseconds approximately, in which no diffusion occurs.

The halogen lamps HL are turned off after a predetermined time has elapsed since the treatment by the flash heating ends. Accordingly, the temperature of the semiconductor wafer W rapidly falls from the preheating temperature T1. The radiation thermometer 120 measures the falling temperature of the semiconductor wafer W and notifies the control unit 3 of a result of the measurement. Based on the result of the measurement by the radiation thermometer 120, the control unit 3 monitors whether the temperature of the semiconductor wafer W has fallen to a predetermined temperature. Then, after the temperature of the semiconductor wafer W has fallen to the predetermined temperature or lower, the pair of the transfer arms 11 of the transfer mechanism 10 is again horizontally moved from the retracted position to the transfer operation position and moved up. Accordingly, the lift pins 12 protrude out of the upper surface of the susceptor 74 to receive the thermally treated semiconductor wafer W from the susceptor 74. Subsequently, the conveyance opening 66, which has been closed by the gate valve 185, is opened to allow the conveyance robot outside the apparatus to proceed the conveyance arm to below the semiconductor wafer W placed on the lift pins 12 through the conveyance opening 66 and the slit 69 of the support 68. In this state, the pair of the transfer arms 11 are lowered to transfer the semiconductor wafer W from the lift pins 12 to the conveyance arm of the conveyance robot. Then, when the conveyance robot removes the conveyance arm holding the semiconductor wafer W out of the upper space 65, the semiconductor wafer W is conveyed out of the thermal treatment apparatus 1, which completes the heating treatment of the semiconductor wafer W at the thermal treatment apparatus 1.

In the present preferred embodiment, the ring support 68 is attached to the inner wall surface of the chamber 6 to support the susceptor 74. When placed on the susceptor 74, the semiconductor wafer W covers holes such as the opening 78 and the through-holes 79. Thus, when the semiconductor wafer W is supported by the susceptor 74, the upper space 65 and the lower space 67 are substantially separated from each other.

In the chamber 6, a small number of particles are potentially generated from, for example, the drive units of the transfer mechanism 10. The particles generated in the chamber 6 are likely to accumulate particularly on the lower chamber window 64 as the floor part of the chamber 6. Since the flash lamps FL instantaneously emit high energy flash light in an extremely short irradiation time between 0.1 millisecond and 100 milliseconds approximately, the flash light irradiation provides impact on the chamber 6. When the impact is provided on the chamber 6 at the flash heating, the particles accumulated on the lower chamber window 64 are blown up in the lower space 67 inside the chamber 6. However, the particles blown up in the lower space 67 are prevented from flowing into the upper space 65 since the upper space 65 and the lower space 67 are separated from each other. As a result, the semiconductor wafer W is prevented from being contaminated by the particles blown up at the flash light irradiation and adhering to the surface of the semiconductor wafer W.

The inner peripheral surface of the support 68 is mirrored by nickel plating. With this configuration, at the flash light irradiation, flash light emitted by the flash lamps FL and having reached the support 68 is reflected by the inner peripheral surface of the support 68 before being incident on the surface of the semiconductor wafer W. As a result, a larger quantity of flash light reaches the surface of the semiconductor wafer W at the flash light irradiation, which leads to a larger increase in the temperature of the front surface of the semiconductor wafer W.

In the present preferred embodiment, the flat plate susceptor 74 is supported by the support 68 attached to the inner wall surface of the chamber 6, which is a simple structure. This simple structure contributes low cost and quick delivery in a process of manufacturing the susceptor 74.

In the present preferred embodiment, the semiconductor wafer W is supported by the circular-disk shaped susceptor 74 supported by the ring support 68 attached to the inner wall surface of the chamber 6. With this configuration, the semiconductor wafer W is surrounded by a symmetric structure. As a result, flash light on the front surface of the semiconductor wafer W when irradiated with flash light has improved in-plane uniformity of illuminance distribution, which leads to favorable in-plane uniformity of temperature distribution. The symmetric structure surrounding the semiconductor wafer W allows treatment gas to symmetrically flow in the upper space 65, which further improves the in-plane uniformity of temperature distribution of the semiconductor wafer W.

The support 68 is detachably attached to the inner wall surface of the chamber 6. With this configuration, the support 68 can be easily replaced when discolored and contaminated due to adhesion of any material released from the semiconductor wafer W, the temperature of which is increased.

Although the preferred embodiment of the present invention is described above, the present invention is applicable to various kinds of modifications made on the above-described preferred embodiment without departing from the scope of the present invention. For example, in the above-described preferred embodiment, the ring support 68 covers the upper part of the inner wall surface of the chamber 6 and supports the susceptor 74 by suspending. However, the susceptor 74 does not necessarily need to be suspended. FIG. 8 is a diagram illustrating another exemplary support. In FIG. 8, any element identical to that in FIG. 1 is denoted by an identical reference sign. The configuration illustrated in FIG. 8 differs from that in FIG. 1 in the shape of the support.

In the configuration illustrated in FIG. 8, a ring support 168 is provided to protrude from the inner wall surface of the chamber 6. The support 168 is detachably attached to the inner wall surface of the chamber 6, but does not cover the upper part of the inner wall surface of the chamber 6. With this configuration, the susceptor 74 is supported with its peripheral part being placed on an upper surface of the support 68 instead of being suspended.

Also in the configuration illustrated FIG. 8, when the semiconductor wafer W is supported by the susceptor 74, the upper space 65 and the lower space 67 are substantially separated from each other. With this configuration, similarly to the above-described preferred embodiment, the semiconductor wafer W can be prevented from being contaminated due to particles flowing into the upper space 65 and adhering to the surface of the semiconductor wafer W after being blown up at the flash light irradiation. Thus, the present invention is applicable to any ring support member attached to the inner wall surface of the chamber 6 to support the plate susceptor 74.

In the above-described preferred embodiment, nitrogen is supplied to both of the upper space 65 and the lower space 67, but different kinds of treatment gas may be supplied to the upper space 65 and the lower space 67. When the semiconductor wafer W to be treated is, for example, a semiconductor substrate on which a high-dielectric-constant film (high-k film) is formed, the first gas supplying mechanism 81 may supply ammonia to the upper space 65 and the second gas supplying mechanism 85 may supply nitrogen to the lower space 67. Accordingly, the upper space 65 is filled with an ammonia atmosphere and the lower space 67 is filled with a nitrogen atmosphere. However, mixing of the atmospheres in both spaces is minimized since the upper space 65 and the lower space 67 are substantially separated from each other.

In the configurations illustrated in FIGS. 1 and 8, the radiation thermometer 120, which measures the temperature of the semiconductor wafer W being thermally treated, is installed in the lower space 67. Typically, the radiation thermometer 120 is calibrated for use in a nitrogen atmosphere. The radiation thermometer 120 thus needs to be recalibrated when used in an ammonia atmosphere because ammonia absorbs part of infrared in a wavelength band used by the radiation thermometer 120 in measurement. However, since the upper space 65 housing the semiconductor wafer W is filled with an ammonia atmosphere and the lower space 67 is filled with a nitrogen atmosphere as described above, the radiation thermometer 120 does not need to be recalibrated to accurately measure the temperature of the semiconductor wafer W treated in the ammonia atmosphere. Since only the upper space 65 is filled with an ammonia atmosphere, a smaller amount of ammonia is consumed.

The radiation thermometer 120 may be installed in the upper space 65 to measure the temperature of the front surface of the semiconductor wafer W. In the present preferred embodiment, the plate susceptor 74 is supported by the ring support 68 attached to the inner wall surface of the chamber 6. The support 68, which is made of aluminum or stainless steel, does not transmit light emitted by the halogen lamps HL. Thus, when the semiconductor wafer W is supported by the susceptor 74, the light emitted by the halogen lamps HL is shielded by the support 68 and the semiconductor wafer W and prevented from leaking into the upper space 65. Accordingly, when installed in the upper space 65, the radiation thermometer 120 can measure the temperature of the semiconductor wafer W without being affected by the light from the halogen lamps HL.

In the above-described preferred embodiment, the flash heating unit 5 includes 30 flash lamps FL, but the present invention is not limited thereto. An optional number of the flash lamps FL may be provided. The flash lamps FL are not limited to xenon flash lamps, but may be krypton flash lamps. The number of the halogen lamps HL included in the halogen heating unit 4 is not limited to 40, but may be any optional number.

In the above-described preferred embodiment, the technology according to the present invention is applied to the thermal treatment apparatus 1 configured to irradiate the semiconductor wafer W with flash light from the flash lamps FL after the preheating with the halogen lamps HL. However, the technology according to the present invention is applicable to any apparatus configured to heat the semiconductor wafer W only with halogen lamps (for example, a spike annealing apparatus or a CVD apparatus), and is also applicable to a laser annealing apparatus.

While the invention has been shown and described in detail, the foregoing description is in all aspects illustrative and not restrictive. It is therefore understood that numerous modifications and variations can be devised without departing from the scope of the invention.

What is claimed is:

1. A thermal treatment method for housing a substrate in a chamber and performing thermal treatment on the substrate, the thermal treatment method comprising the steps of:
    (a) partitioning the chamber into an upper space and a lower space, with a support member attached to an inner wall surface of the chamber and extending along an inner peripheral direction of the chamber, and a plate quartz susceptor supported by the support member, wherein the upper space is defined to be a space surrounded by the upper chamber window of the chamber, the susceptor, and the support member, and the lower space is defined to be a space surrounded by the lower chamber window of the chamber, the susceptor, and the inner wall surface of the chamber;
    (b) arranging continuously turned-on lamps below the chamber;
    (c) arranging flash lamps above the chamber;

(d) supporting the substrate on the susceptor for housing the substrate in the upper space;
(e) supplying nitrogen gas from a first gas source to the lower space via a first tube;
(f) supplying reactive gas from a second gas source to the upper space via a second tube;
(g) preheating the substrate by irradiating, through the lower space, a back surface of the substrate with light from the continuously turned-on lamps arranged below the chamber;
(h) measuring a temperature of the back surface of the substrate by a radiation thermometer disposed below the susceptor; and
(i) turning on the flash lamps to irradiate a front surface of the substrate with flash light when the radiation thermometer detects that the temperature of the substrate has reached a predetermined preheating temperature.

2. The thermal treatment method according to claim 1, wherein the radiation thermometer is calibrated for use in a nitrogen atmosphere.

3. The thermal treatment method according to claim 1, further comprising
(j) discharging the gas from the upper space and the lower space in the chamber,
wherein in said step (j), the gas is discharged from the upper space and the lower space using a shared discharge mechanism.

* * * * *